US012808030B2

(12) United States Patent
Madsen et al.

(10) Patent No.: US 12,808,030 B2
(45) Date of Patent: Nov. 24, 2026

(54) METHOD OF PASSIVATING SURFACE EFFECTS IN METAL OXIDE LAYERS AND DEVICES COMPRISING THEREOF

(71) Applicant: Syddansk Universitet, Odense M (DK)

(72) Inventors: Morten Madsen, Sønderborg (DK); Mehrad Ahmadpour, Sønderborg (DK)

(73) Assignee: Syddansk Universitet, Odense M (DK)

( * ) Notice: Subject to any disclaimer, the term of this patent is extended or adjusted under 35 U.S.C. 154(b) by 0 days.

(21) Appl. No.: 18/558,264

(22) PCT Filed: Apr. 29, 2022

(86) PCT No.: PCT/EP2022/061538
§ 371 (c)(1),
(2) Date: Oct. 31, 2023

(87) PCT Pub. No.: WO2022/233737
PCT Pub. Date: Nov. 10, 2022

(65) Prior Publication Data

US 2024/0224553 A1 Jul. 4, 2024

(30) Foreign Application Priority Data

May 5, 2021 (EP) .................................... 21172248

(51) Int. Cl.

| | |
|---|---|
| ***C23C 14/00*** | (2006.01) |
| ***C23C 14/08*** | (2006.01) |
| ***H10K 30/15*** | (2023.01) |
| ***H10K 30/85*** | (2023.01) |

(Continued)

(52) U.S. Cl.
CPC ........ *C23C 14/0036* (2013.01); *C23C 14/083* (2013.01); *H10K 30/151* (2023.02); *H10K 30/85* (2023.02); *H10K 85/50* (2023.02); *H10K 30/50* (2023.02)

(58) Field of Classification Search
CPC .... H10K 30/85; H10K 30/10; C23C 14/0036; C23C 14/083
See application file for complete search history.

(56) References Cited

U.S. PATENT DOCUMENTS

2009/0091033 A1* 4/2009 Gao .................... C23C 14/0036 257/E21.535
2014/0060648 A1 3/2014 Prasad et al.
(Continued)

FOREIGN PATENT DOCUMENTS

CN 112510120 A 3/2021
EP 3499597 A1 6/2019
(Continued)

OTHER PUBLICATIONS

Yang et al., "Study of perovskite solar cells based on mixed-organic-cation FAXMA1xPbl3 absorption layer", Phys. Chem. Chem. Phys., 2019, 21, 11822. (Year: 2019).*
(Continued)

*Primary Examiner* — Tae-Sik Kang
(74) *Attorney, Agent, or Firm* — Dinsmore & Shohl LLP

(57) ABSTRACT

The present invention relates to a method of producing a metal oxide layer on a substrate, to a method of producing an optoelectronic device or an electrochemical device and to an optoelectronic device comprising a metal oxide layer.

15 Claims, 4 Drawing Sheets

(51) Int. Cl.
*H10K 85/50* (2023.01)
*H10K 30/50* (2023.01)

(56) References Cited

U.S. PATENT DOCUMENTS

| | | | | |
|---|---|---|---|---|
| 2015/0064483 | A1 | 3/2015 | Thompson et al. | |
| 2016/0111224 | A1* | 4/2016 | Charbonneau ........... | C09D 5/24 438/85 |

FOREIGN PATENT DOCUMENTS

| | | | |
|---|---|---|---|
| WO | 2017/212363 | A1 | 12/2017 |
| WO | 2020248063 | A1 | 12/2020 |

OTHER PUBLICATIONS

Zhan et al., "New advances in non-fullerene acceptor based organic solar cells", RSC Adv., 2015, 5, 93002. (Year: 2015).*
WIPO/ISA/EPO, International Search Report and Written Opinion issued on Aug. 31, 2022 in PCT/EP2022/061538, 12 pages.
WIPO, International Preliminary Report on Patentability issued on Nov. 16, 2023 in PCT/EP2022/061538, 7 pages.
Mirsafaei, M. et al. "Sputter-Deposited Titanium Oxide Layers as Efficient Electron Selective Contacts in Organic Photovoltaic Devices", ACS Appl. Energy Mater. 2020, 3, 253-259.
Klasen, A. et al.: "Removal of Surface Oxygen Vacancies Increases Conductance Through TiO2 Thin Films for Perovskite Solar Cells", J. Phys. Chem. C 2019, 123, 13458-13466.
European Patent Office; Communication pursuant to Article 94(3) EPC issued in app. No. 22726646.7 dated Jul. 31, 2025 (5 pages).

* cited by examiner

METHOD OF PASSIVATING SURFACE EFFECTS IN METAL OXIDE LAYERS AND DEVICES COMPRISING THEREOF

CROSS-REFERENCE TO RELATED APPLICATIONS

The present application claims priority to PCT application serial no. PCT/EP2022/061538, filed Apr. 29, 2022, which claims priority to European patent application serial no. 21172248.3, filed May 5, 2021, each herein incorporated by reference in their entireties.

FIELD OF THE INVENTION

The present invention relates to a method of producing a metal oxide layer on a substrate, to a method of producing an optoelectronic device or an electrochemical device and to an optoelectronic device comprising a metal oxide layer.

BACKGROUND OF THE INVENTION

Metal oxide thin films are widely used for several applications, for example as coatings in microelectronic devices, sensors, photoconductors, filters and photovoltaics.

Properties and correspondent performances of metal oxide thin films are strongly dependent on the presence of surface defects within the metal oxide thin films or layers.

In particular, metal oxide layers surface defects may be crucial as catalyzing undesired reactions within thin film solar cell applications.

In photovoltaics applications, metal oxide thin films are frequently used as interlayers in flexible thin film solar cells where they are interfaced to organic and hybrid active layers in order to efficiently extract charges out of the cells.

Chemical surface reactions at the metal oxide and organic/hybrid interfaces may significatively hamper the lifetime of the solar cell.

In that, there is a need for a method for minimizing or avoiding surface defects, in particular for solar cell application, such as in organic photovoltaic devices.

Hence a method of producing a metal oxide layer minimizing the presence or avoiding the formation of surface defects would be advantageous.

OBJECT OF THE INVENTION

An object of the present invention is to provide a method of producing a metal oxide layer minimizing the presence or avoiding the formation of surface defects.

An object of the present invention may also be seen as to provide a method of producing an optoelectronic device or an electrochemical device comprising a metal oxide layer minimizing the presence or avoiding the formation of surface defects.

A further object of the present invention may be seen as to provide an optoelectronic device comprising a metal oxide layer having minimal surface defects.

An object of the present invention may also be seen as to provide an alternative to the prior art.

In particular, it may be seen as an object of the present invention to provide a method of producing a metal oxide layer minimizing the presence or avoiding the formation of surface defects that solves the above-mentioned problems of the prior art by controlling the cooling protocol at the end of a sputtering process.

SUMMARY OF THE INVENTION

The above-described object and several other objects are intended to be obtained in a first aspect of the invention by providing a method of producing a metal oxide layer on a substrate, the method comprising: providing a substrate into a deposition chamber; heating the substrate at a predefined temperature for a predefined period of time and maintaining the heating; introducing at least one carrier gas and at least one reacting gas; sputtering the metal oxide layer under a ratio of the carrier gas and the reacting gas, thereby forming the metal oxide layer of a desired thickness; cooling the sputtered substrate to a preferred temperature and under a flow of at least one processing gas for a preferred period of time, thereby preventing formation of, or passivating surface defects of the sputtered metal oxide layer.

According the first aspect of the invention the method of producing a metal oxide layer prevents formation of or passivate possible surface defects by controlling the cooling protocol at the end of a sputtering process. Possible surface defects may be, for example, oxygen vacancies within the metal oxide layer.

According to the method of the invention, a substrate, such as a transparent substrate, for example a transparent conductive substrate, is firstly introduced into a deposition chamber.

Transparent is herein defined as having an average transmittance higher than 80% with the Visible (VIS) spectrum, i.e. between 380 nm to 800 nm.

A transparent conductive substrate may be a glass substrate coated with a layer of conductive material, such as a transparent conductive oxide (TCO), for example Indium Tin Oxide (ITO).

In some embodiments, for applications in which transparency of the substrate is not needed, the substrate may be have transmittance lower 80% with the VIS spectrum.

The deposition chamber may be a vacuum chamber, such as an ultra-high vacuum sputter deposition chamber.

In the vacuum chamber, reduced pressure may be achieved through the use of a rough-pump and a fine-pump. The substrate is heated at a predefined temperature for a predefined period of time prior sputtering and the heat is maintained while sputtering.

A rough-pump is herein defined as a pump operating in the first stage of a high vacuum or a ultra high vacuum system operating within a range above $1\times10^{-3}$ mbar.

A fine-pump is herein defined as a pump operating in the second stage of a high vacuum or a ultra high vacuum system operating in a range below $1\times10^{-3}$ mbar.

In some embodiments, the predefined temperature of the substrate is between 80° C. and 600° C., such as at 150° C., such as at 400° C. or at 350° C.

In some embodiments, the predefined period of time is between 1 and 120 minutes, such as 10, 20, 40, 50 or 60 minutes, for example 30 minutes.

The sputtering or reactive sputtering is then started by closing the valve for the fine-pump and by introducing at least one carrier gas and at least one reacting gas.

The at least one carrier gas may be or comprise an inert gas, such as Argon gas.

The at least one carrier gas is generally introduced at a high flow rate.

After power is applied to the sputter-head to ignite the plasma, the carrier gas flow may be gradually reduced while the power is increased so as to reach the desired set point.

The at least one reacting gas may be introduced in the vacuum chamber through a controlled valve when the flow of the at least one carrier gas and the power reach the desired value. Upon stabilization of the deposition rate, the deposition of the metal oxide layer begins.

The at least one reacting gas may comprise oxygen gas.

The deposition of the metal oxide layer may be performed in constant power, constant flow of the at least one reacting gas or constant rate depending on the applications of the metal oxide layers to be produced. The sputtering or the deposition of sputtered particles of the metal oxide layer may therefore occur for a desired period of time and may be carried under different ratio of carrier gas and reacting gas, such as a constant ratio of the carrier gas and of the reacting gas, thereby forming the metal oxide layer having a desired thickness.

In some other embodiments, the desired period of time is between 1 and 120 minutes, such as 10, 20, 40, 50 or 60 minutes, for example 30 minutes.

The metal oxide layer thickness may be between 1 and 30 nm, such as 15 nm.

In some embodiments, the pressure, while sputtering is maintained under $5\times10^{-3}$ mbar. In some further embodiments, the pressure is maintained between $5\times10^{-2}$ and $3\times10^{-4}$ mbar, while sputtering.

In some embodiments, the ratio of reacting gas is between 1% to 50%, such as 25%, over reacting gas and carrier gas, i.e. over the total amount of gas.

The heating of the substrate during deposition have the advantage of producing a preferred type of crystallization of the metal oxide layers.

In some embodiments, the metal oxide may be a transition metal oxide (TMO), such as titanium oxide ($TiO_x$).

When the TMO use is $TiO_x$ a preferred crystallization form may be a combination of a dominant rutile phase with small area of anatase phase.

In some other embodiments, the metal oxide may be tin oxide, ($SnO_x$).

When the thickness of the metal oxide layer reaches the desired value, the valve controlling the introduction of the at least one reacting gas is shut.

During the cooling of the substrate at a preferred temperature and during a preferred period of time, the valve controlling the at least one processing gas is opened, allowing the flow of the at least one processing gas within the vacuum chamber, while the power starts decreasing.

In some embodiments, the preferred temperature is lower than 100° C.

In some other embodiments, the preferred period of time is between 1 and 120 minutes, such as 10, 20, 40, 50 or 60 minutes, for example 30 minutes.

In some embodiments, the flow of the at least one processing gas is between 1 and 20 sccm, such as 5 sccm at a preferred pressure between $10^{-4}$ mbar and $10^{-2}$ mbar, such as $10^{-3}$ mbar.

Standard cubic centimeters per minute (SCCM) is the unit of flow measurement indicating cubic centimeters per minute ($cm^3$/min) in standard conditions.

The at least one processing gas is the at least one carrier gas or the at least one reacting gas.

In some embodiments, the flow may be a constant flow of the at least one processing gas.

In some other embodiments, the flow may be 0 sccm, i.e. there may be no flow of the at least one processing gas.

When the power reaches 0%, the valve controlling the at least one carrier gas is shut, and the fine-pump engages so as to pump down the vacuum chamber.

When the fine-pump turns off, the heating of the substrate is stopped.

Once the substrate is back at room temperature, this process is concluded and the sputtered substrate can be retrieved.

The introduction of the cooling step following the reactive sputtering process, i.e. in-line with the same coating process, prevents the formation of, or passivates, surface defects of the sputtered metal oxide layer.

The reaction of the fresh and still heated surface of the sputtered films with the at least one processing gas provides metal oxide thin films generating very stable interfaces with additional layers subsequently deposited.

The optimization of this process depends on the optimized reactive sputtering process parameters, i.e. background pressure, temperature and reactive gas pressure, which controls composition and microstructure of the metal oxide layer.

In a second aspect, the invention relates to a method of producing an optoelectronic device or an electrochemical device, the method comprising: producing a metal oxide layer on a substrate according to the first aspect of the invention; depositing a layer of light harvesting material onto the metal oxide layer; depositing a contact layer onto the layer of light harvesting material; depositing a metal contact onto the contact layer.

The contact layer may be a hole transport layer (HTL).

The substrate may be a transparent substrate, such as a transparent conductive substrate, or a TCO.

In a third aspect, the invention relates to an optoelectronic device comprising a metal oxide layer produced, such as sputtered, according to the first aspect of the invention.

In a fourth aspect, the invention relates to an optoelectronic device, such as a solar cell, for an organic solar cell, produced according to the second aspect of the invention.

In general, photocatalytic degradation of active layers in organic solar cells or Organic Photovoltaics (OPVs) is mainly due to interface reaction between the active layer and the metal oxide layer. The interface reaction is catalyzed by oxygen vacancies within the metal oxide surface.

The method of the invention introducing a cooling or passivation step achieves the reduction of surface defects improving performance and stability of the metal oxide layers used in OPVs.

Through the cooling or passivation step following the reactive sputtering process, i.e. in-line in the same coating process, the metal oxide thin films produced generate a stable interface to the organic and hybrid active layers subsequently deposited in the construction of an organic solar cell.

In a fifth aspect, the invention relates to an optoelectronic device, such as a non-fullerene acceptor based organic solar cell, comprising: a transparent conductive substrate; an electron transport layer (ETL) located onto the transparent conductive substrate, such as a metal oxide layer produced according to any of the first aspect of the invention; a layer of light harvesting material, such as a combination of light harvesting organic materials; a hole transport layer (HTL) located onto the layer of light harvesting material; a metal contact located onto the HTL.

The light harvesting material may be a perovskite-based material.

The metal oxide layers of the invention may also be used in different type of electrochemical devices, such as energy storage devices or light emitting devices, for example Organic Light Emitting Diodes (OLEDs)

A further advance of the metal oxides layers of the invention is that they can be produced in an in-line reactive sputtering process, such as a Roll-to-Roll (R2R) vacuum sputtering.

The first and other aspects and embodiments of the present invention may each be combined with any of the other aspects and embodiments. These and other aspects of the invention will be apparent from and elucidated with reference to the embodiments described hereinafter.

BRIEF DESCRIPTION OF THE FIGURES

The method of producing a metal oxide layer, an optoelectronic device or an electrochemical device and the optoelectronic device comprising a metal oxide layer of the invention will now be described in more details with regard to the accompanying figures. The figures show one way of implementing the present invention and are not to be construed as being limiting to other possible embodiments falling within the scope of the attached claim set.

DETAILED DESCRIPTION OF AN EMBODIMENT

Figure 1:
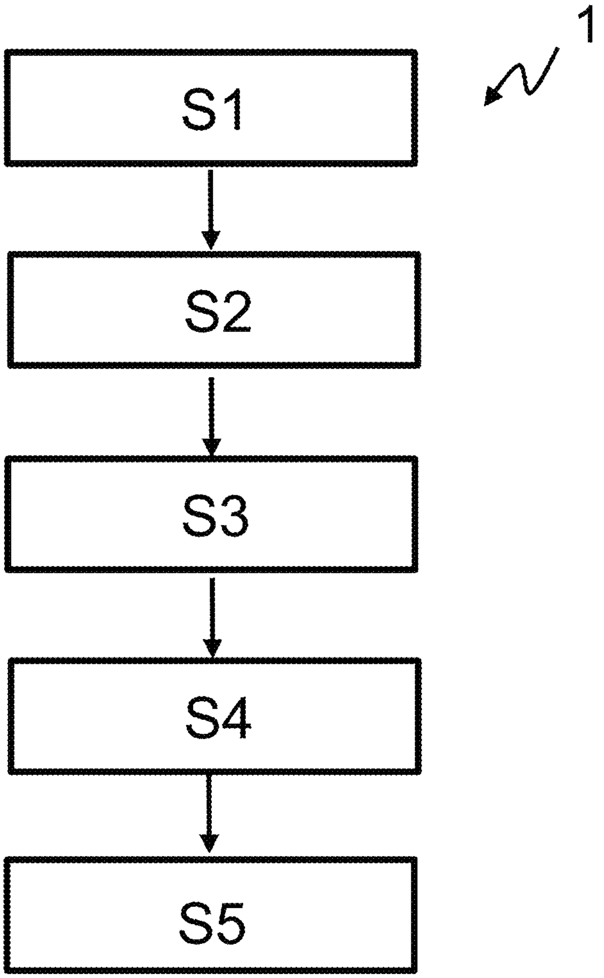
FIG. 1 is a flow chart of the method of producing a metal oxide layer according to some embodiments of the invention.

FIG. 1 is a flow chart of the method 1 of producing a metal oxide layer on a substrate.

The method 1 comprises the steps of:

- S1, providing a substrate into a deposition chamber;
- S2, heating the substrate at a predefined temperature for a predefined period of time and maintaining the heating;
- S3, introducing at least one carrier gas and at least one reacting gas;
- S4, sputtering the metal oxide layer under a ratio of the carrier gas and the reacting gas, thereby forming the metal oxide layer of a desired thickness;
- S5, cooling the sputtered substrate to a preferred temperature and under a flow of at least one processing gas for a preferred period of time, thereby preventing formation of, or passivating possible surface defects of the sputtered metal oxide layer.

Figure 2:
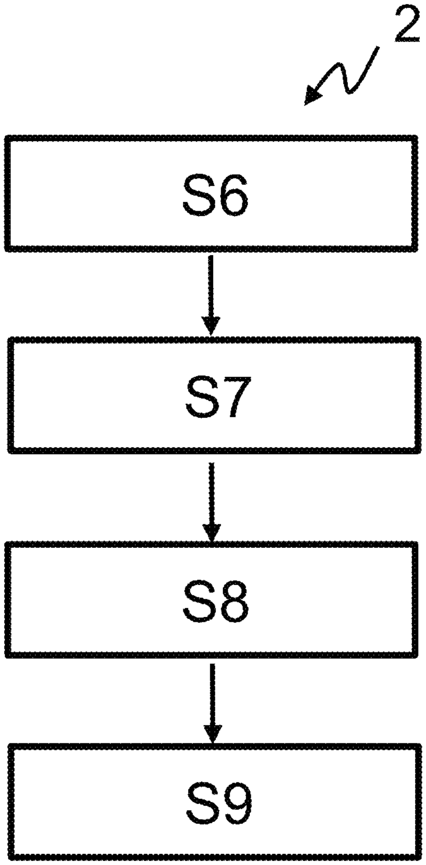
FIG. 2 is a flow chart of the method of producing an optoelectronic device or an electrochemical device according to some other embodiments of the invention.

FIG. 2 is a flow chart of the method 2 of producing an optoelectronic device or an electrochemical device.

The method 2 comprises the steps of:

- S6, producing a metal oxide layer on a substrate according to method 1;
- S7, depositing a layer of light harvesting material onto the metal oxide layer;
- S8, depositing a contact layer onto the layer of light harvesting material;
- S9, depositing a metal contact onto the contact layer.

Figure 3:
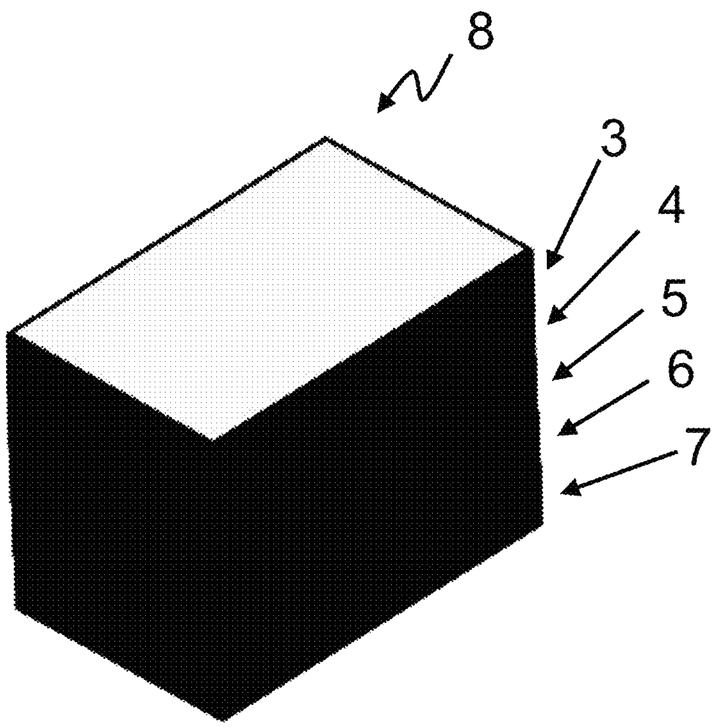
FIG. 3 is a schematic illustration of an organic solar cell according to some embodiments of the invention comprising PBDB-T:ITIC as donor/acceptor light harvesting composition.

FIG. 3 is a schematic illustration of an organic solar cell 8 according to some embodiments of the invention.

The organic solar cell 8 comprises a conductive glass substrate 7 coated with a thin layer of ITO. A Ti oxide layer 6 of few nanometers is deposited onto the ITO layer 6 according to the method of the first aspect of the invention.

A layer of PBDB-T:ITIC 5 is spin coated onto the Ti oxide layer 6.

Optimal thickness may be achieved by repeated spin coating at predetermined speed and for a predetermined period of time.

A further layer of $MoO_3$4 is deposited onto the PBDB-T:ITIC and a Ag contact layer 3 is finally deposited by, for example, thermal evaporation.

Figure 4:
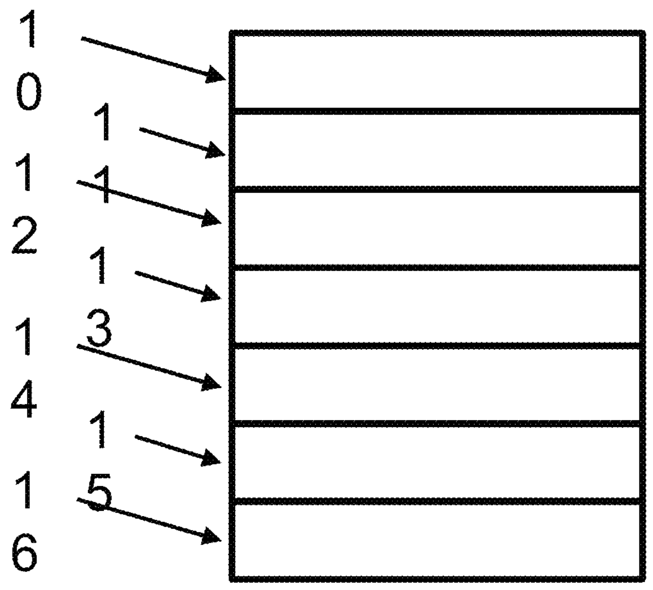
FIG. 4 is a schematic illustration of an organic solar cell according to some embodiments of the invention comprising perovskite as light harvesting material.

FIG. 4 is a schematic illustration of an organic solar cell 17 according to some embodiments of the invention.

The organic solar cell 17 has a glass substrate 16 coated with a thin layer of ITO 15. A $TiO_2$ layer 14, 15 nm thick, is sputtered onto the conductive substrate according to the method of the first aspect of the invention.

A layer of perovskite 13 is deposited, by, for example, spin coating, onto the Ti oxide layer 14.

A passivation layer 12 is deposited onto the perovskite layer 13 to further suppress defects of the perovskite polycrystalline layer 13.

A further layer of Spiro-OMeTAD 11 as HTL material is further deposited onto the passivation layer 12 and a Au contact layer 10 is finally deposited by, for example, thermal evaporation.

Figure 5:
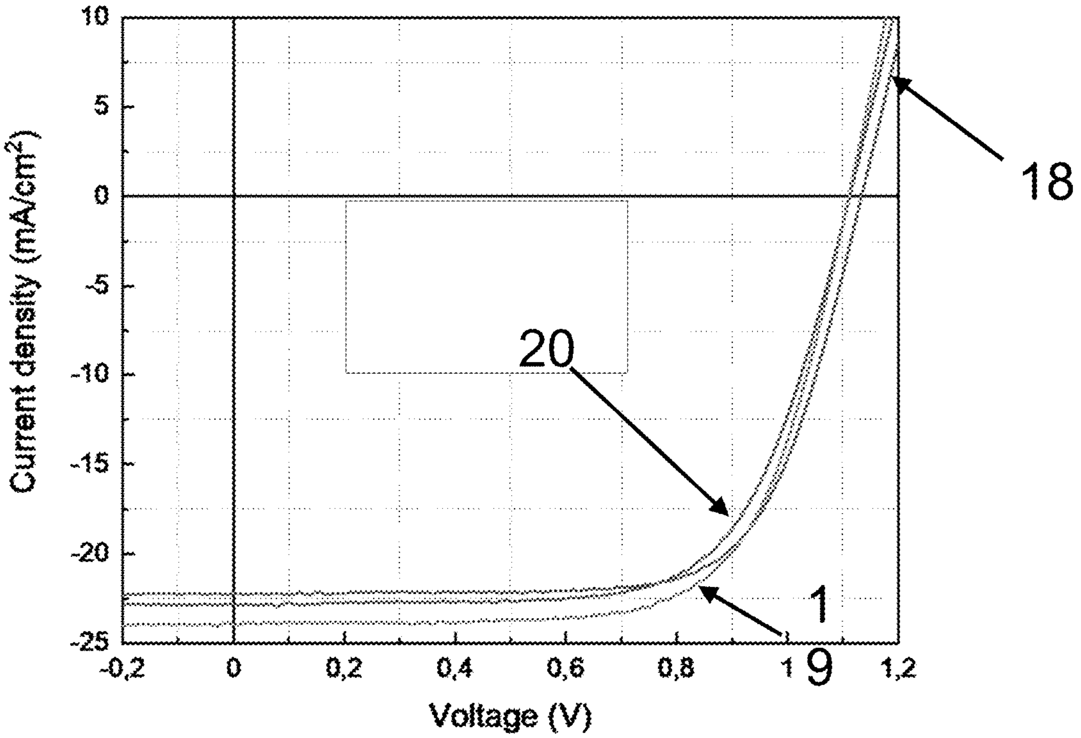
FIG. 5 is a graph showing current-voltage characteristics of a solar cells having a configuration as described in FIG. 4.

FIG. 5 is a graph showing current-voltage (IV) characteristics of the solar cell 17 described by FIG. 4.

The graph compares the IV curves of a solar cell having the configurations as in FIG. 4 in which a layer of $TiO_2$ is deposited either through standard processing, i.e. line 18, through the method of the invention in which $TiO_2$ is sputtered keeping the temperature of the substrate at 150° C., i.e. line 19 or through the method of the invention in which $TiO_2$ is sputtered keeping the temperature of the substrate at 350° C., i.e. line 20.

Figure 6:
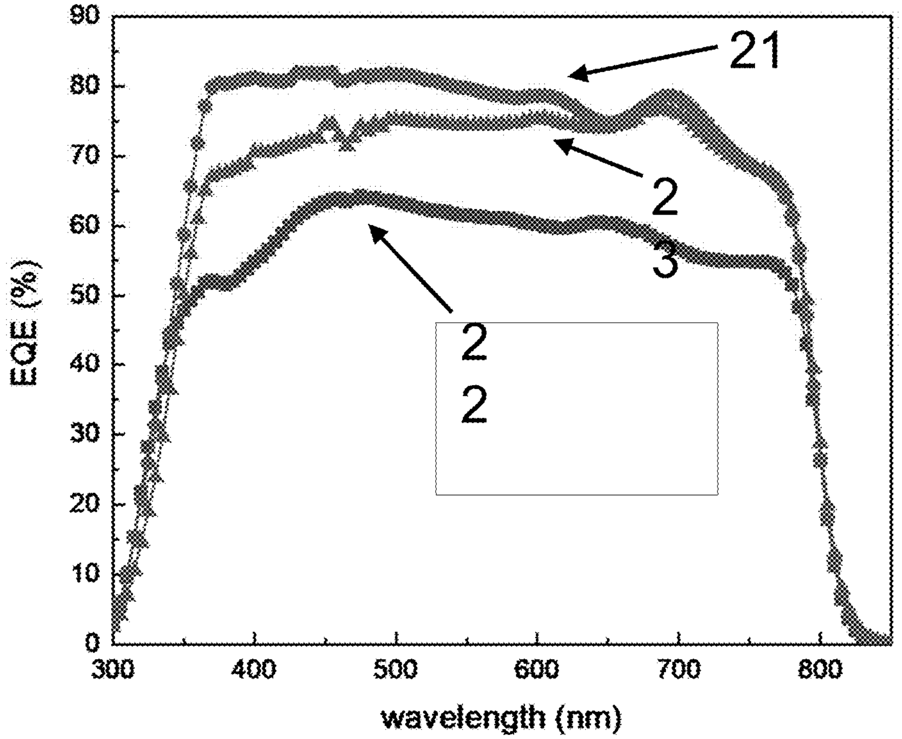
FIG. 6 is a graph showing the External Quantum Efficiency (EQE) vs wavelength for solar cells having a configuration as described in FIG. 4.

FIG. 6 is a graph showing the External Quantum Efficiency (EQE) vs wavelength of solar cell 17 as described in FIG. 4.

The graph compares as in FIG. 5, performances of a solar cell having the configurations as in FIG. 4 in which a layer of $TiO_2$ is deposited either through standard processing, i.e. line 22, through the method of the invention in which $TiO_2$ is sputtered keeping the temperature of the substrate at 150° C., i.e. line 23 or through the method of the invention in which $TiO_2$ is sputtered keeping the temperature of the substrate at 350° C., i.e. line 21.

Clearly better performances of energy conversion can be observed for the solar cell having a 15 nm $TiO_2$ layer sputtered through the method of the invention keeping the temperature of the substrate at 350° C.

Figure 7:
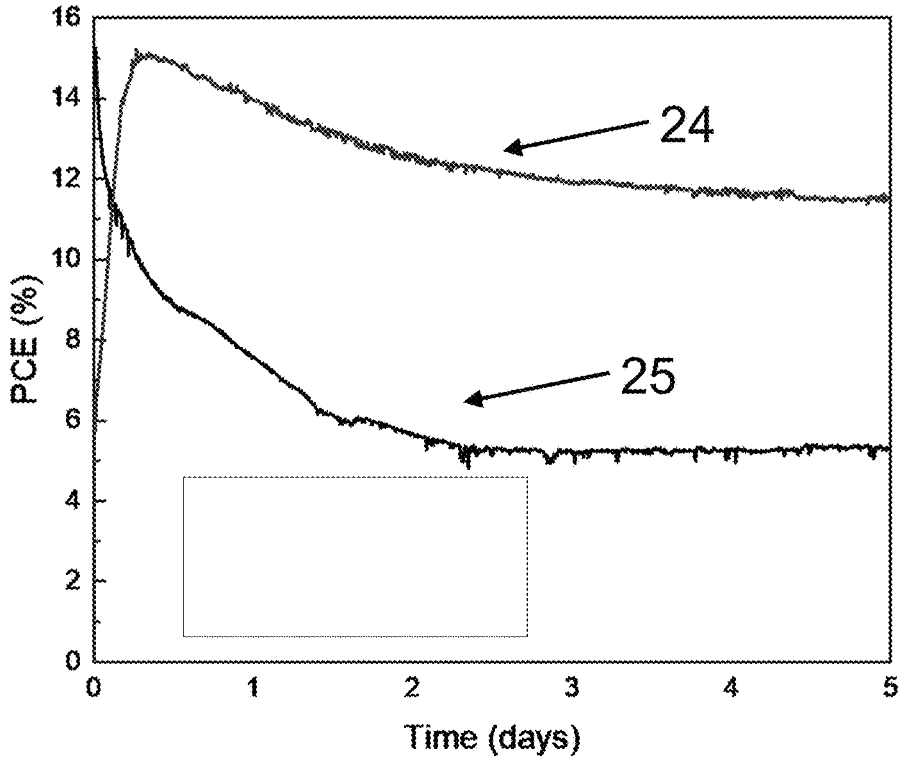
FIG. 7 is a graph showing the evolution of normalized Power Conversion Efficiency (PCE) (stability), over time at 1 sun light illumination and at Room Temperature (RT), i.e. between 20 and 25° C., of the solar cells having a configuration as described in FIG. 4.

FIG. 7 is a graph comparing the evolution of normalized PCE (stability) for a solar cell as described in FIG. 4 in which the layer of $TiO_2$ is deposited either through standard processing, i.e. line 25, or through the method of the invention in which $TiO_2$ is sputtered keeping the temperature of the substrate at 350° C., i.e. line 24.

From FIG. 7 it can be noticed that, through the method of the invention, the life time of the solar cell is improved as, after 5 days, the PCE of the solar cell sample having a 15 nm $TiO_2$ layer sputtered through the method of the invention is almost three times higher than the one of the solar cell sample in which the layer of $TiO_2$ is deposited through standard processing.

Figure 8:
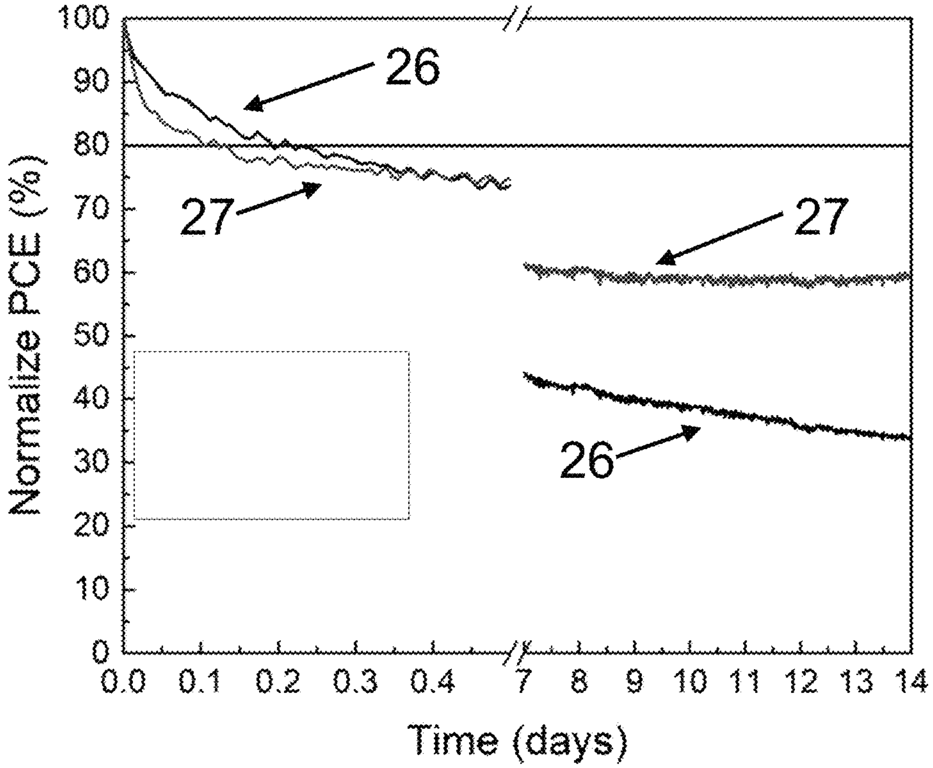
FIG. 8 is a graph showing the evolution of normalized PCE (stability), over time at 1 sun light illumination and at RT, for two solar cells, one using the titanium dioxide layer of the invention and a configuration as in FIG. 4, the other one using a standard ZnO layer in a correspondent configuration.

FIG. 8 is a graph showing the evolution of normalized PCE (stability) for two solar cell, one using the $TiO_2$ of the invention, i.e. line 27 in a configuration as in FIG. 4, the other one using a standard ZnO layer, i.e. line 26 in a correspondent configuration.

Also in this case, through the method of the invention, the lifetime of the solra cell is improved as, after 14 days, the sample produced according to the method of the invention showed a normalized PCE of 60% compared to a PCE of 35% for a solar cell having a standard ZnO layer.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. In addition, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method of producing a solar cell, said method comprising producing a metal oxide layer on a substrate by providing the substrate into a deposition chamber;

heating said substrate at a predefined temperature for a predefined period of time and maintaining said heating;

introducing at least one carrier gas and at least one reacting gas comprising oxygen gas;

sputtering said metal oxide layer under a ratio of said carrier gas and said reacting gas, thereby forming said metal oxide layer of a desired thickness;

cooling said sputtered substrate to a preferred temperature and under a flow of at least one processing gas for a preferred period of time, wherein said predefined period of time is between 1 and 120 minutes, thereby preventing formation of, or passivating possible surface defects of said sputtered metal oxide layer;

depositing a layer of light harvesting material onto said metal oxide layer;

depositing a contact layer onto said layer of light harvesting material;

depositing a metal contact onto said contact layer.

2. The method according to claim 1, wherein said predefined temperature is between 100° C. and 600° C.

3. The method according to claim 1, wherein said at least one carrier gas comprises argon.

4. The method according to claim 1, wherein said metal oxide is titanium oxide (TiOx).

5. The method according to claim 1, wherein said ratio is between 1% to 50% of said at least one reacting gas over said at least one reacting gas and said at least one carrier gas.

6. The method according to claim 1, wherein said preferred temperature is lower than 100° C.

7. The method according to claim 1, further comprising maintaining a pressure between $5\times10^{-2}$ and $3\times10^{-4}$ mbar while sputtering.

8. The method according to claim 1, wherein said flow of said at least one processing gas is between 1 and 20 sccm at a preferred pressure between $10^{-4}$ mbar and $10^{-2}$ mbar.

9. The method according to claim 1, wherein said deposition chamber is an ultra-high vacuum sputter deposition chamber.

10. The method according to claim 1, wherein said substrate is a transparent conductive substrate.

11. The method according to claim 1, wherein said at least one processing gas is said at least one carrier gas or said at least one reacting gas.

12. The method according to claim 2, wherein the predefined temperature is 150° C. or 350° C.

13. The method according to claim 5, wherein said ratio is 25%.

14. The method according to claim 8, wherein said flow of said at least one processing gas is 5 sccm.

15. The method according to claim 8, wherein said preferred pressure is $10^{-3}$ mbar.

* * * * *